United States Patent [19]
Sansa

[11] Patent Number: 4,562,514
[45] Date of Patent: Dec. 31, 1985

[54] POLARIZED ELECTRONIC COMPONENT AND ITS MANUFACTURING PROCESS

[75] Inventor: José V. Sansa, Barcelona, Spain

[73] Assignee: Componentes Electronicos SA-C.S.A., Barcelona, Spain

[21] Appl. No.: 588,708

[22] Filed: Mar. 12, 1984

[30] Foreign Application Priority Data

Mar. 18, 1983 [FR] France .................. 83 04482

[51] Int. Cl.⁴ .......... H01G 9/00; H01L 7/02; B65D 73/02
[52] U.S. Cl. .................... 361/433; 29/589; 206/331; 361/306
[58] Field of Search ........... 361/306, 308, 310, 433; 206/328, 331; 29/589; 357/74

[56] References Cited

U.S. PATENT DOCUMENTS

| 3,795,844 | 3/1974 | Markarian | 361/433 |
| 3,828,227 | 8/1974 | Millard et al. | 361/310 X |
| 3,972,062 | 7/1976 | Hopp | 357/74 X |
| 4,064,611 | 12/1977 | Sobozenski et al. | 361/433 X |
| 4,247,883 | 1/1981 | Thompson et al. | 361/433 |
| 4,261,005 | 4/1981 | McCarthy | 357/74 X |
| 4,288,842 | 9/1981 | Voyles | 361/433 |

FOREIGN PATENT DOCUMENTS 2178847 11/1973 France .

Primary Examiner—Donald A. Griffin
Attorney, Agent, or Firm—Cushman, Darby & Cushman

[57] ABSTRACT

The present invention concerns a polarized chip type electronic component comprising a body provided with a cathode contact or negative input and an anode contact or positive output. A first metallic caliper is connected to the cathode contact and a second metallic caliper is disposed opposite the first, substantially parallel to it, the second caliper being constituted by one face extended by two lateral arms, the face comprising a fold which is substantially parallel to the arms of the said caliper and on which is fixed the anode wire, an insulating packing material being disposed between the two calipers in such a way as to coat its body and its electrodes. The fold in the caliper gives an external notification of polarization.

14 Claims, 3 Drawing Figures

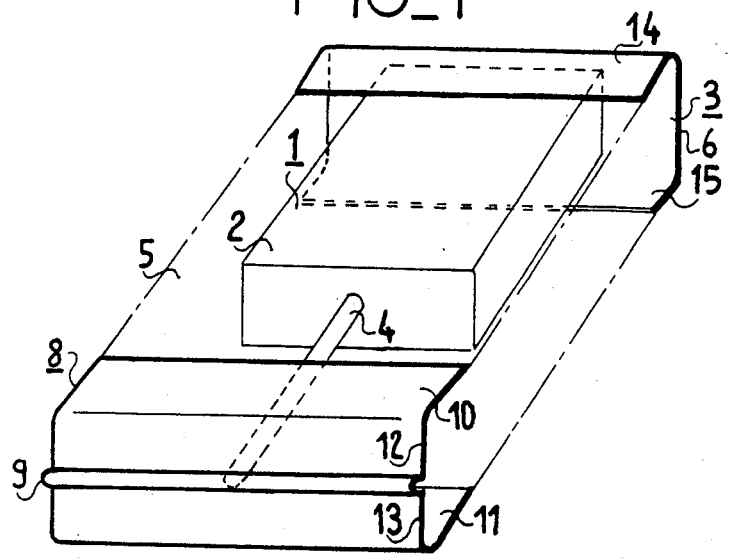
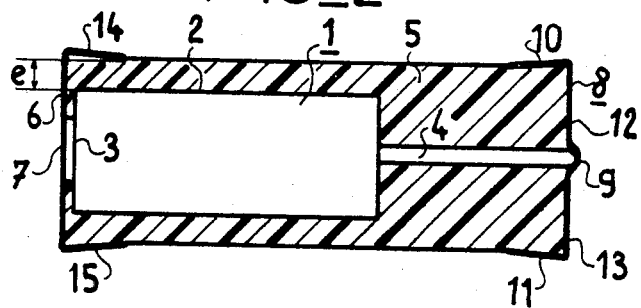
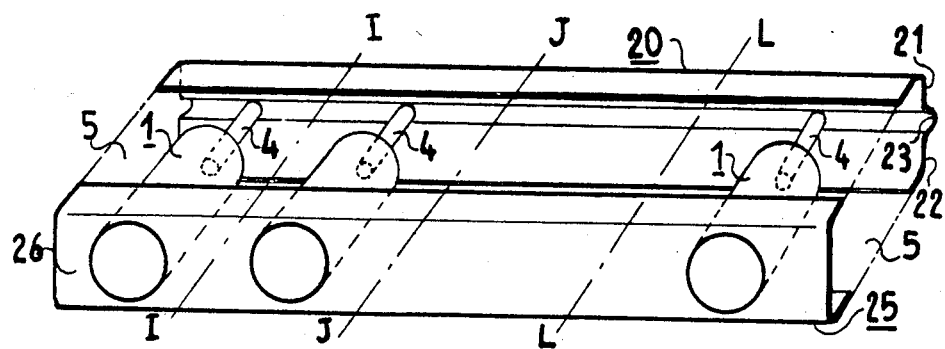

POLARIZED ELECTRONIC COMPONENT AND ITS MANUFACTURING PROCESS

BACKGROUND OF THE INVENTION

The present invention concerns a polarized electronic component of a substantially parallelepipedic shape and without visible connection wire, able to be flat welded on printed circuits and hybrid circuits. This type of electronic component (chips) is normally called a "chip".

DESCRIPTION OF THE PRIOR ART

These components are currently being increasingly developed since they have the advantage of avoiding the necessity of piercing the printed circuits. They are generally fixed in their definitive position by a glue spot and the printed card is there after wave welded. Components of this type currently available in trade are for example chip ceramic capacitors of a parallelepipedic shape and comprising terminations in the form of calipers disposed on two opposite lateral faces of this capacitor.

For the polarized type components such as, for example, tantalum capacitors, diodes, etc., the problem of locating the anode and the cathode arises when it is required to give them the same external shape.

It is known from U.S. Pat. No. 3,588,629 to overcome this problem by realizing precut metallic bands and by fixing the cathode of the component on a full part of the band and the anode on a part integral with it but separated by an opening. Then the band is separated into individual components by cutting the electrical and mechanical contact existing between the cathode support and anode support. Such a process possesses the double drawback on one hand of necessitating metallic attachment bands of exact and very specific cut, and on the other hand, of increasing relatively considerably the surface occupied by the component on the circuit with respect to the surface of the body of the component.

The chip type polarized electronic component according to the invention allows the problem raised to be overcome in a simple way.

SUMMARY OF THE INVENTION

This component, which comprises a body provided with an anode contact and a cathode contact, has a first metallic caliper connected to the contact of the cathode (or negative output) and a second metallic caliper disposed opposite the first and substantially parallel to it. The second caliper consists of a face extended by two lateral arms, the face having a fold, substantially parallel to the arms of the said caliper. In this fold is fixed the anode wire (or positive output), and an insulating packing material disposed between the two calipers in such a way as to coat the body and its electrodes.

Preferably, the cathode contact will consist of the external surface of the body of the component, electrically insulated from the anode. The first caliper then surrounds the body on the face opposite the one crossed by the anode. The section of the calipers will preferably have externally a U-shape, the branches of which tighten slightly.

Externally, it is easy to distinguish the anode from the cathode, since a longitudinal on the anode caliper fold is disposed, preferably situated in the middle of the face of this caliper. Futhermore this longitudinal fold allows furthermore automatic component insertion machines to locate mechanically the caliper face. In order to further improve the automatic locating possibilities of the faces of the components, one of its faces, preferably that having the attachment fold of the anode wire, will be made of magnetic or magnetizable material. Of course, the fold allows location of the anode or the cathode, at choice.

The invention also concerns a process for manufacturing such a chip type polarized electronic component. In this process, two long calipers are disposed facing each other, one with a U-section, the other with a U-section provided with a longitudinal fold parallel to the arms of the "U". The calipers are disposed side by side at the distance polarized type electronic components require, by inserting the body of each component the surface of which forms the cathode in the U-shaped caliper and by inserting the anode wire of each component in the fold, the assembly thus formed being coated by insulated resin and then cut into individual components.

BRIEF DESCRIPTION OF THE DRAWINGS

The invention will be better understood by reading through the following realization examples, given by way of non-limitative example, with reference to the drawings which represent:

FIG. 1, a view of component according to the invention;

FIG. 2, a section view of the component of FIG. 1;

FIG. 3, a view illustrating the process of manufacture of the components according to the invention.

DESCRIPTION OF THE PREFERRED EMBODIMENTS

FIG. 1 shows a tantalum electrolytic capacitor 1, known per se, which is attached between two calipers 3 and 8. The body 2 of the capacitor 1 is inserted between the two arms 14 and 15 connected between each other by the plane face 6 of the caliper 3. The body 2 of the capacitor 1 is inserted between the two arms 14 and 15 connected between each other by the plane face 6 of the caliper 3. The body 2 of (the capacitor 1 the surface of which forms a cathode) is fixed electrically and mechanically by conducting glue 7 or a brazing to the plane face 6 of the caliper 3. The anode wire 4 issuing from the face of the capacitor 1 opposite that attached to the caliper 3 is housed in the caliper fold 9 to which it is preferably electrically welded. The caliper 8 comprises a plane face 12 connected through the intermediary of the longitudinal fold 9 to a second plane face 13, the whole of surfaces 12 and 13 being substantially equivalent to the surface 6 of the caliper 3. Each of these faces 12 and 13 is extended respectively by an arm 10 and 11 substantially orthogonal to it (like arms 14 and 15 with respect to the face 6 of the caliper 3). The fold 9 extends along the whole length of caliper 8, substantially parallel to arms 10 and 11, oriented so as to present a projection on the finished component. A packing resin such as epoxy resin, coats component 1 in such as way as to render calipers 3 and 8 and component 1 integral parts.

FIG. 2 represents a section view of the component of FIG. 1, on which the same elements bear the same references. It will be noted in particular on this figure the distance called "e" generally separating the body of the component 1 from the upper arm 14 as well as that existing at the level of the lower arm 15 of the caliper 3

(in practice "e" is about one millimeter, enough to allow the coating resin to adhere to the body of the component). Similarly, it will be observed that the length of the wire of the anode 4 is sufficient not to deteriorate the electric characteristics of the components during welding of the anode wire in the fold. In practice, for tantalum capacitors, such an anode wire length, from its output of the housing to the bottom of the caliper fold is of several millimeters.

The component described herein-above can be fastened to a printed circuit by brazing, for example, calipers arms 11 and 15 (or 10 and 14) after gluing the component onto the circuit prior to wave brazing. The caliper arms with be preferably treated in order to facilitate brazing. It will be noted that the solution according to the invention does not increase the volume occupied by the component. The tightening of the U-shaped branches of the caliper allowing to leave a passage under the component after brazing on the circuit, allows cleaning of the circuit.

FIG. 3 represents schematically the operating of the process according to the invention, the same elements as these of the preceding figures, bearing the same references. The calipers are respectively in the form of very long opposite facing "U"-shaped rolled sections. One of these rolled sections 25 has a rear plane face 26 while the other rolled section 20, situated opposite it, comprises a rear face constituted by a plane part 21 of a longitudinal fold 23 then by a second plane part 22. These rolled sections are disposed in the same way as the calipers herein-above. The polarized components 1 are then introduced by longitudinal translation, for example, in the direction of the arrow F, relative with respect to the rolled sections or bars. The body of the capacitors is fixed within the corresponding caliper by simultaneous brazing after introduction and maintenance of the components in the rolled sections previously coated inside with a brazing layer, then the anode wires are welded electrically in the fold. When the components have been disposed at regular intervals between the rolled sections, in the way explained here-in-above, the assembly is thus coated with epoxy resin 5, for example. After polymerization of the resin, the individual capacitors are cut along the lines such as II, JJ, etc., LL. Of course, the metals that constitute the calipers are chosen to be compatible with the anode and cathode wires of the coated components. In particular, in the case of the capacitors of the tantalum type foreseen herein-above, the nickel, alone or in the form of an alloy will be used at least as a superficial layer.

I claim:

1. A chip type polarized electronic component comprising:
    a body, including a cathode contact and an anode contact;
    a first metallic caliper connected to said cathode contact having a first face extended by two arms substantially perpendicular to said first face to form a generally "U"-shaped channel;
    a second metallic caliper, disposed opposite said first metallic caliper, said second caliper having a second face, extended by two lateral arms substantially perpendicular to said second face, said second face having a fold which extends substantially parallel to said arms of said second caliper and in which is fixed said anode contact; and
    an insulating packing material, disposed between said first and second calipers so as to coat said body and contacts.

2. An electronic component according to claim 1, wherein said cathode contact is constituted by the external surface of said body which is electrically insulated from the anode, said first caliper surrounding said body on the side of said body opposite that through which said anode wire issues.

3. An electric component according to claim 2, wherein said fold is situated in the centre of the face of said second caliper.

4. An electric component according to claim 3, wherein the distance between the output of said anode of said body and said fold in which said wire of said anode is electrically welded is sufficient not to deteriorate the electric characteristics of said component during said welding.

5. An electric component according to claim 4, wherein said the fold is apparent from the outside of said component so as to realize a means of location for automatic insertion machines.

6. An electronic compound according to claim 1, wherein one of said calipers is made of magnetic and/or magnetizable material.

7. An electronic component according to claim 1, wherein each said caliper comprises at least one arm positioned on the same side with respect to the body of the component, the metal of which is treated for facilitating the brazing.

8. A manufacturing process of a polarized electronic component comprising the steps of:
    disposing opposite each other two substantially "U"-shaped rolled sections or bars substantially parallel to each other which form calipers, one of said calipers possessing a longitudinal fold extending substantially parallel to the arms of the U-shape;
    sliding said components into positions at regular intervals between said two calipers, another caliper having a "U"-section surrounding the body of said component, the surface of said component forming the cathode, while the anode wire of the said component is slipped into the fold of said one caliper;
    welding said two calipers to said component;
    coating said components thus disposed by using a packing material intended to maintain them integral with one another; and
    cutting the assembly thus formed into individual components by separation between the bodies of two successive components.

9. A package for a chip type polarized electronic component adapted to be welded to a PC board, the package covering the chip component and comprising:
    first metallic caliper means for contacting a first terminal of said chip component, said first caliper means comprising:
    (a) a flat plane face,
    (b) a first arm, extending from said plane face over the length of said plane face on one side and substantially perpendicular to said plane face, and
    (c) a second arm, extending from said plane face over the length of said plane face on the other side, substantially parallel to said first arm and perpendicular to said plane face;
    second metallic caliper means for contacting a second terminal of said chip component, said second caliper means comprising:

(a) a second flat plane face including fold means in said second plane face extending over a portion of the area of said second plane face for holding said second terminal of said chip component in electrical contact with said fold means and for indicating polarity on the exterior of said package, (b) a first arm, extending from said second plane face over the length of said second plane face on one side and substantially perpendicular to said second plane face, (c) a second arm, extending from said second plane face over the length of said plane face on the other side, substantially parallel to said first arm of said second metallic caliper and perpendicular to said second plane face, and packing material means for insulating said terminals from one another and for holding said chip component and said package together.

10. A device in claim 9 wherein said second metallic caliper means is generally parallel to said first metallic caliper means.

11. A device as in claim 9 wherein said first terminal is an anode and said second terminal is a cathode.

12. A device as in claim 9 wherein said first terminal is a cathode and said second terminal is an anode.

13. A device as in claim 9 wherein the distance between one of said terminals and the body of said chip component is sufficient not to deteriorate the electrical characteristics of said component during welding and the surface area of the caliper acts as a further heat dissipating mechanism.

14. A device as in claim 9 wherein said first and second caliper means form generally "U"-shaped channels.

* * * * *